United States Patent
Itakura et al.

(10) Patent No.: US 12,181,723 B2
(45) Date of Patent: Dec. 31, 2024

(54) OPTICAL WAVEGUIDE PACKAGE AND LIGHT-EMITTING DEVICE

(71) Applicant: KYOCERA Corporation, Kyoto (JP)

(72) Inventors: Yoshiaki Itakura, Aira (JP); Yasuhiro Fujimoto, Setouchi (JP); Hiroki Ito, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 197 days.

(21) Appl. No.: 17/760,780

(22) PCT Filed: May 28, 2020

(86) PCT No.: PCT/JP2020/021247
§ 371 (c)(1),
(2) Date: Mar. 16, 2022

(87) PCT Pub. No.: WO2021/065078
PCT Pub. Date: Apr. 8, 2021

(65) Prior Publication Data
US 2022/0350097 A1    Nov. 3, 2022

(30) Foreign Application Priority Data

Sep. 30, 2019   (JP) .................................. 2019-180925

(51) Int. Cl.
*G02B 6/42* (2006.01)
*G02B 6/26* (2006.01)

(52) U.S. Cl.
CPC ............. *G02B 6/4257* (2013.01); *G02B 6/42* (2013.01); *G02B 6/4268* (2013.01)

(58) Field of Classification Search
CPC .................................. G02B 6/42; G02B 6/26
USPC ............................................................. 385/14
See application file for complete search history.

(56) References Cited

U.S. PATENT DOCUMENTS

| | | | |
|---|---|---|---|
| 5,780,875 A | | 7/1998 | Tsuji et al. |
| 5,802,222 A | * | 9/1998 | Rasch ................ G02B 26/0808 385/9 |
| 6,112,002 A | * | 8/2000 | Tabuchi ............... G02B 6/4245 385/124 |
| 9,379,525 B2 | * | 6/2016 | McLaurin ............. H01S 5/0203 |
| 10,718,491 B1 | * | 7/2020 | Raring .................... H01S 5/062 |
| 2002/0028045 A1 | * | 3/2002 | Yoshimura .......... H01L 23/5389 385/39 |
| 2010/0189146 A1 | * | 7/2010 | Bessho ................ G11B 7/1275 438/31 |

(Continued)

FOREIGN PATENT DOCUMENTS

| | | |
|---|---|---|
| DE | 19917325 A1 | 10/2000 |
| EP | 0845690 A2 | 6/1998 |

(Continued)

*Primary Examiner* — Kaveh C Kianni
(74) *Attorney, Agent, or Firm* — Volpe Koenig

(57) ABSTRACT

An optical waveguide package includes a substrate, an optical waveguide layer located on an upper surface of the substrate and including a cladding and a core in the cladding, a lid, and a metal member. The cladding includes a first surface facing the substrate, a second surface opposite to the first surface, and an element-receiving area being open in the second surface. The lid covers the element-receiving area. The metal member surrounds the element-receiving area between the cladding and the lid.

16 Claims, 7 Drawing Sheets

(56) References Cited

U.S. PATENT DOCUMENTS

| | | | |
|---|---|---|---|
| 2016/0116690 A1* | 4/2016 | Tanaka | G02B 6/1221 |
| | | | 385/14 |
| 2016/0372893 A1* | 12/2016 | McLaurin | H01S 5/0203 |
| 2017/0317469 A1 | 11/2017 | Kiyota | |
| 2018/0366912 A1* | 12/2018 | Hashimoto | H01S 5/22 |
| 2021/0157071 A1* | 5/2021 | Shikama | G02B 6/4243 |

FOREIGN PATENT DOCUMENTS

| | | | |
|---|---|---|---|
| JP | 05-341143 A | | 12/1993 |
| JP | 08-110446 A | | 4/1996 |
| JP | 09-061651 A | | 3/1997 |
| JP | 9-61676 A | | 3/1997 |
| JP | 9-521353 A | | 12/1997 |
| JP | 10-160976 A | | 6/1998 |
| JP | 10-308555 A | | 11/1998 |
| JP | H10308555 A | * | 11/1998 |
| JP | 2000249876 A | * | 9/2000 |
| JP | 2001-174655 A | | 6/2001 |
| JP | 3324936 B2 | | 9/2002 |
| JP | 2004-258268 A | | 9/2004 |
| JP | 2007-328201 A | | 12/2007 |
| JP | 2008-516525 A | | 5/2008 |
| JP | 2014-238491 A | | 12/2014 |
| JP | 2015-029043 A | | 2/2015 |
| WO | 2006/041576 A1 | | 4/2006 |

\* cited by examiner

OPTICAL WAVEGUIDE PACKAGE AND LIGHT-EMITTING DEVICE

FIELD

The present disclosure relates to an optical waveguide package and a light-emitting device.

BACKGROUND

A known optical waveguide package and a light-emitting device including the optical waveguide package are described in, for example, Patent Literature 1. The known structure includes a substrate, a cladding layer on the substrate, a laser diode (LD) and a photodiode (PD) in etched portions in the cladding layer, and a lid covering the LD and the PD.

CITATION LIST

Patent Literature

Patent Literature 1: Japanese Patent No. 3324936

BRIEF SUMMARY

An optical waveguide package according to an aspect of the present disclosure includes a substrate, a cladding on the substrate, a core in the cladding, a lid, and a metal member. The cladding includes a first surface facing the substrate, a second surface opposite to the first surface, and an element-receiving area being open in the second surface. The core extends from the element-receiving area. The lid covers the element-receiving area. The metal member is located between the cladding and the lid.

A light-emitting device according to another aspect of the present disclosure includes the above optical waveguide package, a light-emitting element in the element-receiving area, and a lens on an optical path of light to be emitted from the core.

DETAILED DESCRIPTION

A light-emitting device according to one or more embodiments of the present disclosure will now be described with reference to the accompanying drawings.

Figure 1:
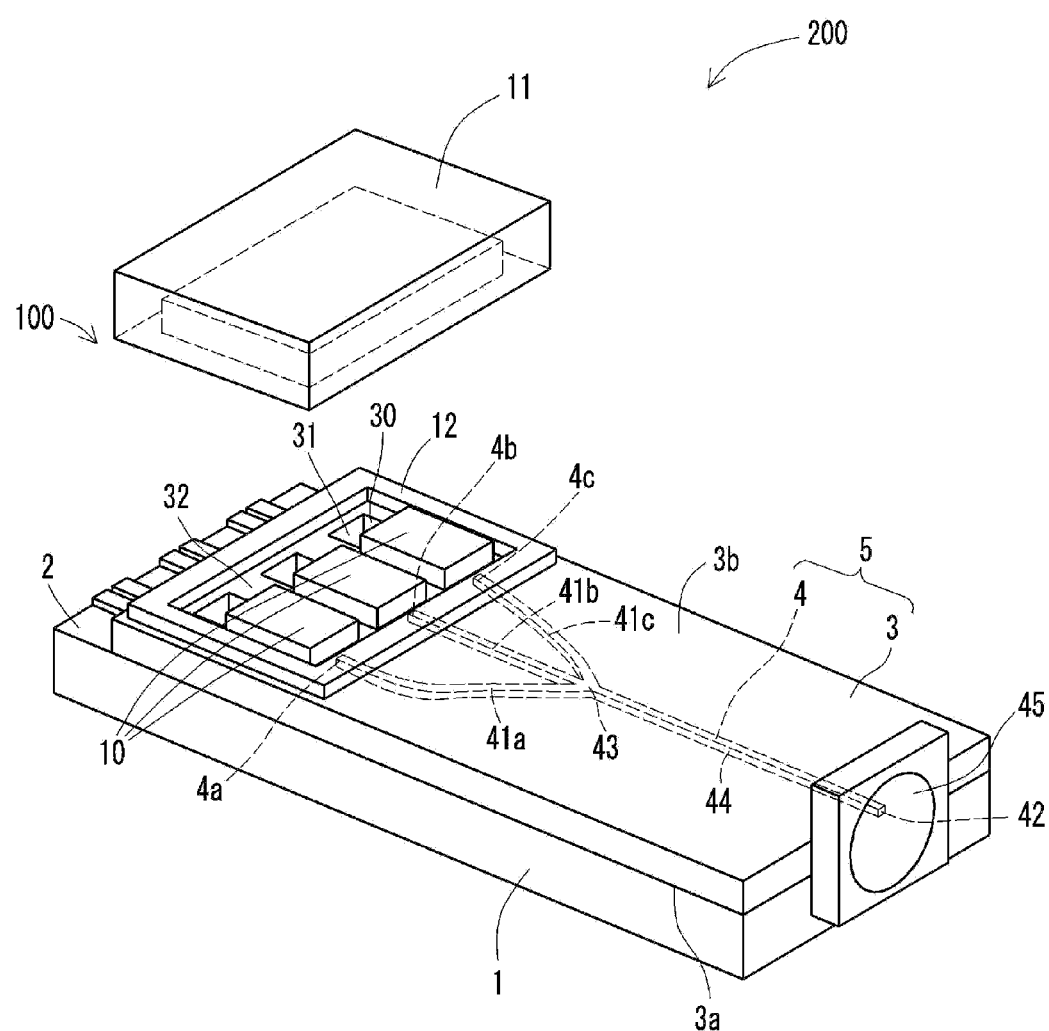
FIG. 1 is an exploded perspective view of a light-emitting device including an optical waveguide package according to an embodiment of the present disclosure.
Figure 2:
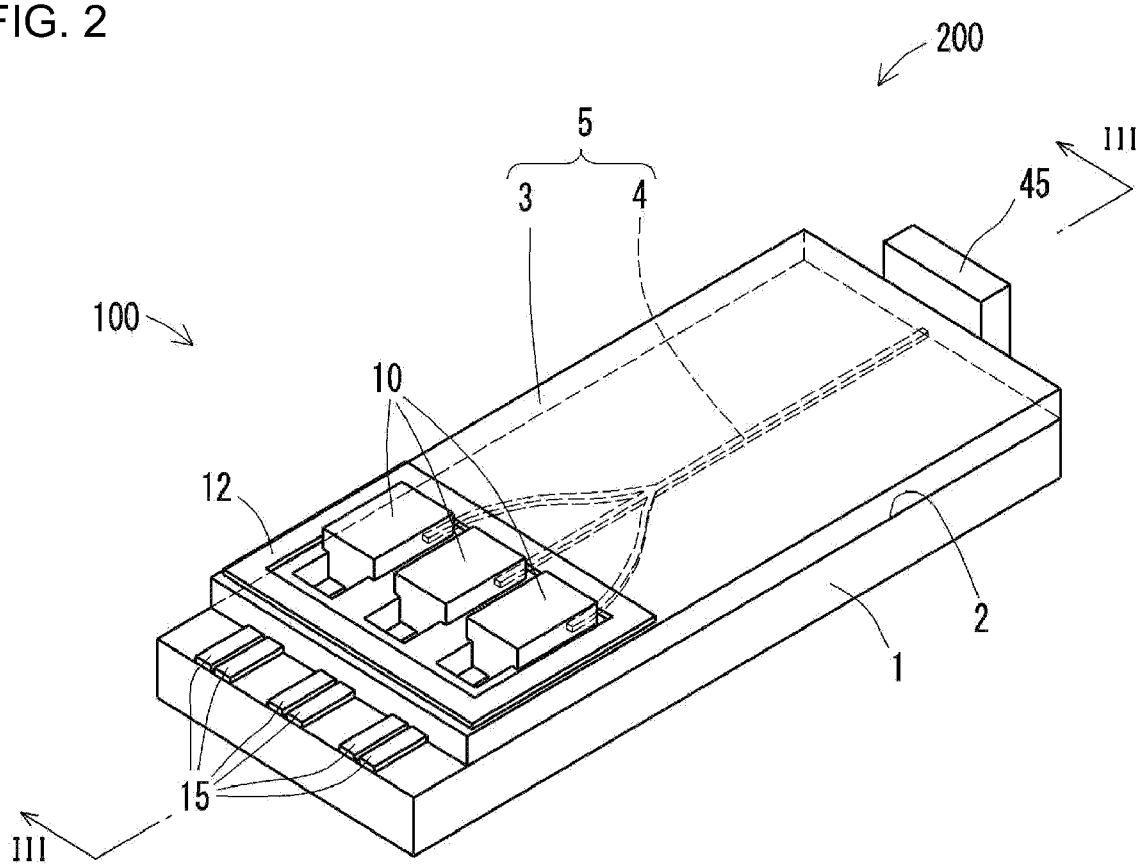
FIG. 2 is a perspective view of the light-emitting device in FIG. 1 without showing a lid.
Figure 3:
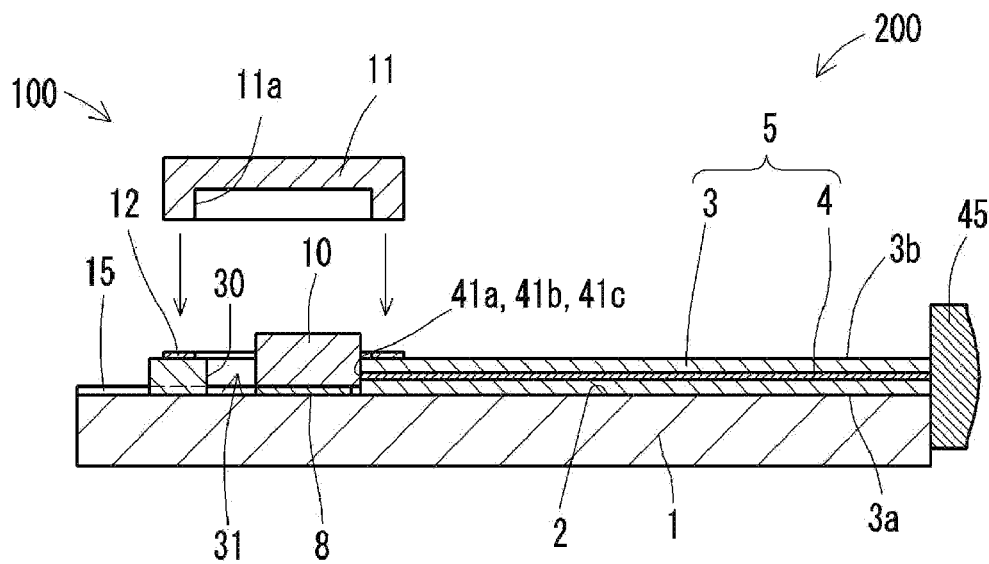
FIG. 3 is a cross-sectional view of the light-emitting device taken along the section line in FIG. 2.
Figure 4:
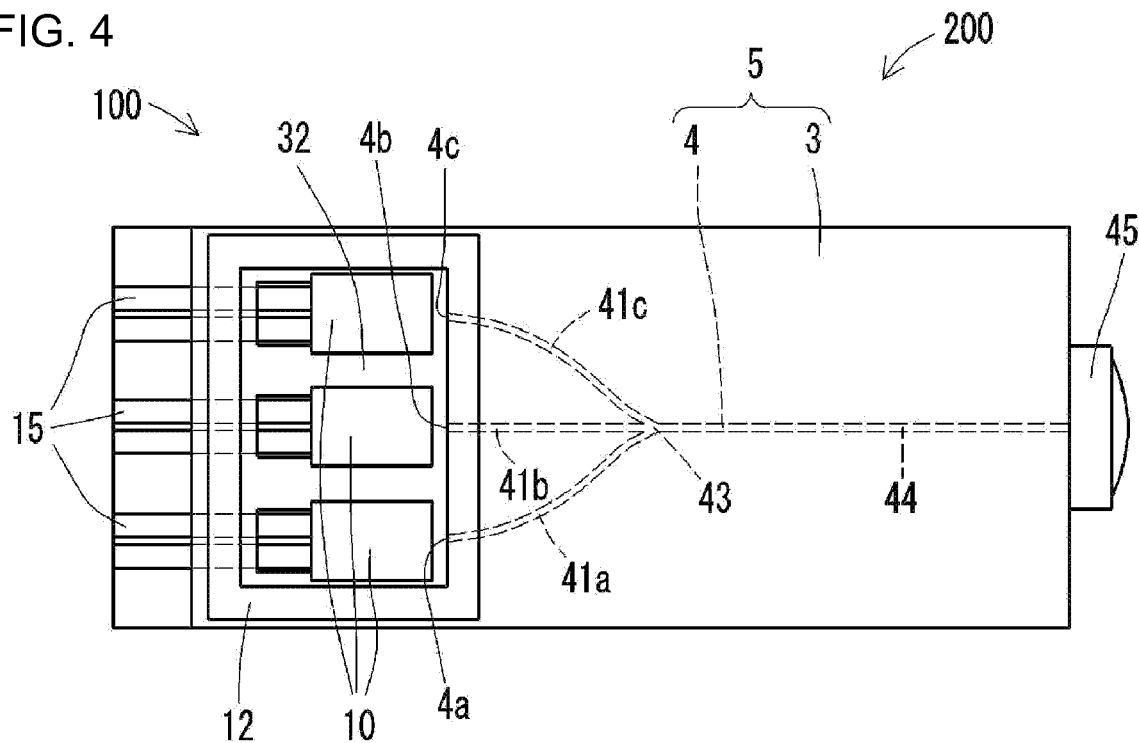
FIG. 4 is a plan view of the light-emitting device.
Figure 5:
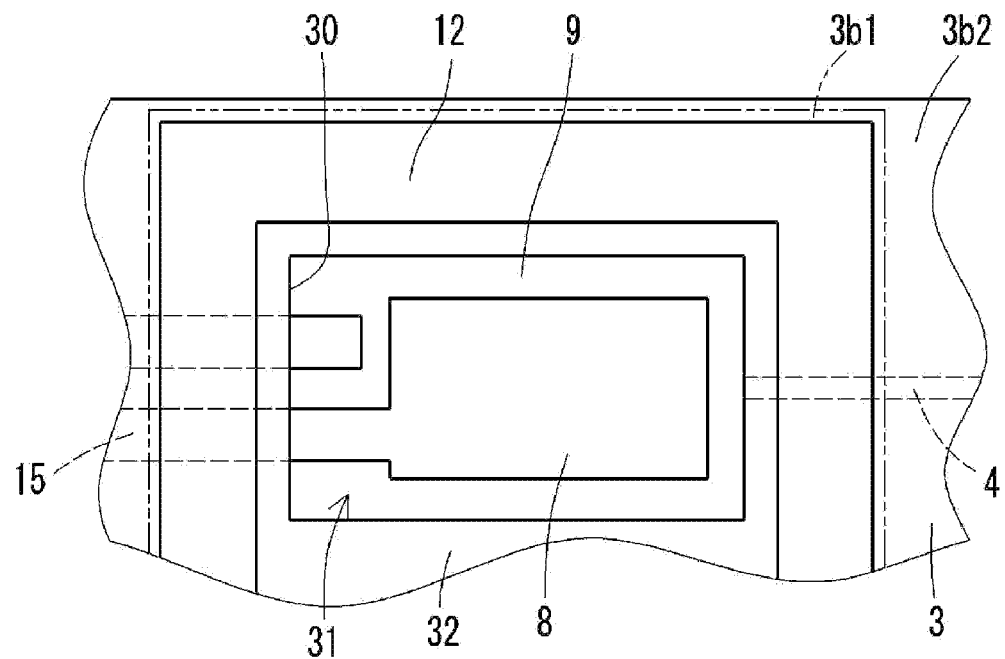
FIG. 5 is an enlarged plan view of an element-receiving area and its adjacent area in the optical waveguide package.

FIG. 1 is an exploded perspective view of a light-emitting device including an optical waveguide package according to an embodiment of the present disclosure. FIG. 2 is a perspective view of the light-emitting device in FIG. 1 without showing a lid. FIG. 3 is a cross-sectional view of the light-emitting device taken along the section line in FIG. 2. FIG. 4 is a plan view of the light-emitting device. FIG. 5 is an enlarged plan view of an element-receiving area and its adjacent area in the optical waveguide package.

An optical waveguide package 100 according to the present embodiment includes a substrate 1, an optical waveguide layer 5, a lid 11, and a metal member 12. The optical waveguide layer 5 is on an upper surface 2 of the substrate 1 and includes a cladding 3 and a core 4 in the cladding 3. The cladding 3 has a first surface 3a facing the substrate 1, a second surface 3b opposite to the first surface 3a, and an element-receiving area 9 that is open in the second surface 3b. The lid 11 covers the element-receiving area 9. The metal member 12 is between the cladding 3 and the lid 11.

The optical waveguide package 100 according to the present embodiment includes multiple (three in the present embodiment) element-receiving areas 9 each accommodating a light-emitting element 10. The optical waveguide package 100, the light-emitting elements 10 in the element-receiving areas 9, and a lens 45 on the optical path of the light emitted from the core 4 form a light-emitting device 200. The light-emitting elements 10 may be laser diodes. The optical waveguide package 100 according to the present embodiment accommodates three light-emitting elements 10. The light-emitting elements 10 emit light with respective colors, for example, red (R) light, green (G) light, or blue (B) light. The optical waveguide layer 5 includes the core 4 and the cladding 3 integral with each other. The substrate 1 may include multiple dielectric layers stacked on one another.

The substrate 1 may be a ceramic wiring board including dielectric layers formed from a ceramic material. Examples of the ceramic material used for the ceramic wiring board include sintered aluminum oxide, sintered mullite, sintered silicon carbide, sintered aluminum nitride, and sintered glass ceramic. For the substrate 1 being a ceramic wiring board, the dielectric layers include conductors such as connection pads, internal wiring conductors, and external connection terminals for electrical connection between the light-emitting and light-receiving elements and an external circuit.

The substrate 1 may be an organic wiring board including dielectric layers formed from an organic material. The organic wiring board may be a printed wiring board, a build-up wiring board, or a flexible wiring board. Examples of the organic material used for the organic wiring board include an epoxy resin, a polyimide resin, a polyester resin, an acrylic resin, a phenolic resin, and a fluororesin.

The optical waveguide layer 5 may be glass such as quartz, or a resin. In the optical waveguide layer 5, both the core 4 and the cladding 3 may be glass or a resin. In some embodiments, one of the core 4 and the cladding 3 may be glass and the other may be a resin. In the above case, the core 4 has a higher refractive index than the cladding 3. The difference in the refractive index causes total internal reflection of light. More specifically, a material with a higher refractive index is used to form a path, which is then surrounded by a material with a lower refractive index. This structure confines light in the core 4 with the higher refractive index.

The core 4 extends from the element-receiving areas 9 to allow light emitted from the light-emitting elements 10 on three element mounting portions 8 to be combined and reach the lens 45 in the present embodiment. For example, the core 4 in the present embodiment has three incident end faces 4a, 4b, and 4c corresponding to the respective element mounting portions 8, and one emission end face 42. The core 4 defines a merging path including branching paths 41a, 41b, and 41c, a merging portion 43, and a joined path 44 between the incident end faces 4a, 4b, and 4c and the emission end face 42. The branching paths 41a, 41b, and 41c respectively have the incident end faces 4a, 4b, and 4c at one end. The merging portion 43 merges the branching paths 41a, 41b, and 41c together. The joined path 44 has the emission end face 42 at one end.

Red (R) light, green (G) light, and blue (B) light emitted from the respective light-emitting elements 10 enter the respective branching paths 41a, 41b, and 41c through the incident end faces 4a, 4b, and 4c and pass through the merging portion 43 and the joined path 44 to the lens 45, through which the light is condensed and emitted.

The lens 45 is, for example, a plano-convex lens with a flat incident surface facing the core 4 and a convex emission surface. The optical waveguide layer 5, the light-emitting elements 10, and the lens 45 are assembled together to have the branching paths 41a, 41b, and 41c each with its optical axis aligned with the center of the light emitter of the corresponding light-emitting element 10, and to have the joined path 44 and the lens 45 with their optical axes aligned with each other.

In the present embodiment, the cladding 3 has through-holes 30 in the second surface 3b. In other words, the cladding 3 also has openings in the first surface 3a. The upper surface 2 of the substrate 1 and the through-holes 30 define compartments 31 for the light-emitting elements 10. Each compartment 31 has the element mounting portion 8 on the bottom. The element mounting portions 8 are used to join the light-emitting elements 10 to the upper surface 2 of the substrate 1. The element mounting portions 8 may include metal members such as metallized layers located on the upper surface 2 of the substrate. The metal members in the element mounting portions 8 are joined to the light-emitting elements 10 with a die bonding material such as a brazing material or an adhesive. In the present embodiment, the metal members in the element mounting portions 8 are connected to external wiring members 15. The light-emitting elements 10 include electrodes on the lower surfaces electrically connectable to the metal members in the element mounting portions 8 and further to, for example, an external power circuit through the external wiring members 15. The external wiring members 15 extend across inside and outside the compartments 31. The light-emitting elements 10 include electrodes on the upper surfaces that may be electrically connected to the external wiring members 15 (not connected to the metal members in the element mounting portions 8) with, for example, bonding wires (not shown).

The lid 11 for covering the element-receiving areas 9 is on the second surface 3b of the cladding 3. The metal member 12 surrounds the element-receiving areas 9 between the lid 11 and the cladding 3 to improve airtightness in the compartments 31 accommodating the light-emitting elements 10. In the present embodiment, the metal member 12 is, for example, in a continuous loop and surrounds the through-holes 30 in a plan view. The cladding 3 and the second surface 3b joined together with the metal member 12 allow the compartments 31 to be more airtight than the cladding 3 and the lid 11 joined together with, for example, a resin adhesive. The lid 11 may be formed from a glass material such as quartz, borosilicate, or sapphire.

The lid 11 may have a recess 11a. In the present embodiment, for example, the lid 11 has the recess 11a facing the element-receiving areas 9. The light-emitting elements 10 extend from the element-receiving areas 9 into the recess 11a. The light-emitting elements 10 received in the element-receiving areas 9 may have a greater height than the cladding 3, or in other words, the light-emitting elements 10 may protrude from the second surface 3b of the cladding 3. The lid 11 receives the protruding areas in the recess 11a and can thus be joined to the cladding 3 with the metal member 12 in between. In other words, the lid 11 with the above structure allows the cladding 3 to be thinner. The lid 11 is located on a first region 3b1 of the cladding 3 and thus reduces the height of the light-emitting device 200.

In the present embodiment, the metal member 12 is located on the second surface 3b of the cladding 3. In this case, for example, the metal member 12 is formed from Ti, Ni, Au, Pt, or Cr, or two or more of these metals, and is fixed on the second surface 3b of the cladding 3 by vapor deposition, sputtering, ion plating, or plating. The lid 11 is joined to the metal member 12 by, for example, thermal curing or laser welding using a bond, such as Au-Sn or Sn-Ag-Cu solder, a metal nanoparticle paste of Ag or Cu, or a glass paste.

The metal member 12 may be located on the lid 11, rather than on the cladding 3, in an area facing the cladding 3. In this case, for example, the metal member 12 is formed from Ti, Ni, Au, Pt, or Cr, or two or more of these metals, and is fixed on the lid 11 by vapor deposition, sputtering, ion plating, or plating. The cladding 3 is joined to the metal member 12 by, for example, thermal curing or laser welding using a bond, such as Au—Sn or Sn—Ag—Cu solder, a metal nanoparticle paste of Ag or Cu, or a glass paste.

The metal member 12 may be located on both the cladding 3 and the lid 11. In this case, the metal member 12 on the cladding 3 is joined to the metal member 12 on the lid 11 by, for example, thermal curing or laser welding using a bond, such as Au—Sn or Sn—Ag—Cu solder, a metal nanoparticle paste of Ag or Cu, or a glass paste.

In the present embodiment, for example, the second surface 3b of the cladding 3 includes the first region 3b1 surrounding the element-receiving areas 9 in a plan view and a second region 3b2 other than the first region 3b1. The lid 11 is located only on the first region 3b1. This structure allows the second region 3b2 to be at a lower height than with the lid 11 extending over the entire second surface 3b including the second region 3b2. The lid 11 may extend over the entire second surface 3b to protect the second surface 3b of the cladding 3.

One compartment 31 may include multiple element mounting portions 8. In other words, such multiple element mounting portions 8 are located in one of the through-holes 30 in a plan view. In the present embodiment, one compartment 31 includes multiple element mounting portions 8 and partitions 32 each between the element-receiving areas 9. The compartment 31, separated by the partitions 32, has spaces defined for the respective element mounting portions 8 to receive the light-emitting elements 10. In other words, the multiple element-receiving areas 9 are separated by the partitions 32 for receiving the light-emitting elements 10. Light emitted from one light-emitting element 10 may be partially reflected without entering the incident end face 4a of the core 4, possibly causing stray light in the compartment 31. This may affect the other light-emitting elements 10. The partitions 32 can reduce the effects of such stray light. The cladding 3 may receive thermal stress upon being heated when, for example, the light-emitting elements 10 are operating, the lid 11 is joined to the cladding 3, or the light-emitting elements 10 are mounted on the element mounting portions 8. The thermal stress may cause deformation of the element-receiving areas 9 and their adjacent areas in the cladding 3, possibly causing cracks, peeling of the metal member 12, or peeling of the cladding from the substrate 1. This may also reduce the airtightness. The partitions 32 can increase the heat transfer paths to dissipate heat, reduce deformation of the cladding 3 under thermal stress, and lower the likelihood of airtightness reduction.

Figure 6A:
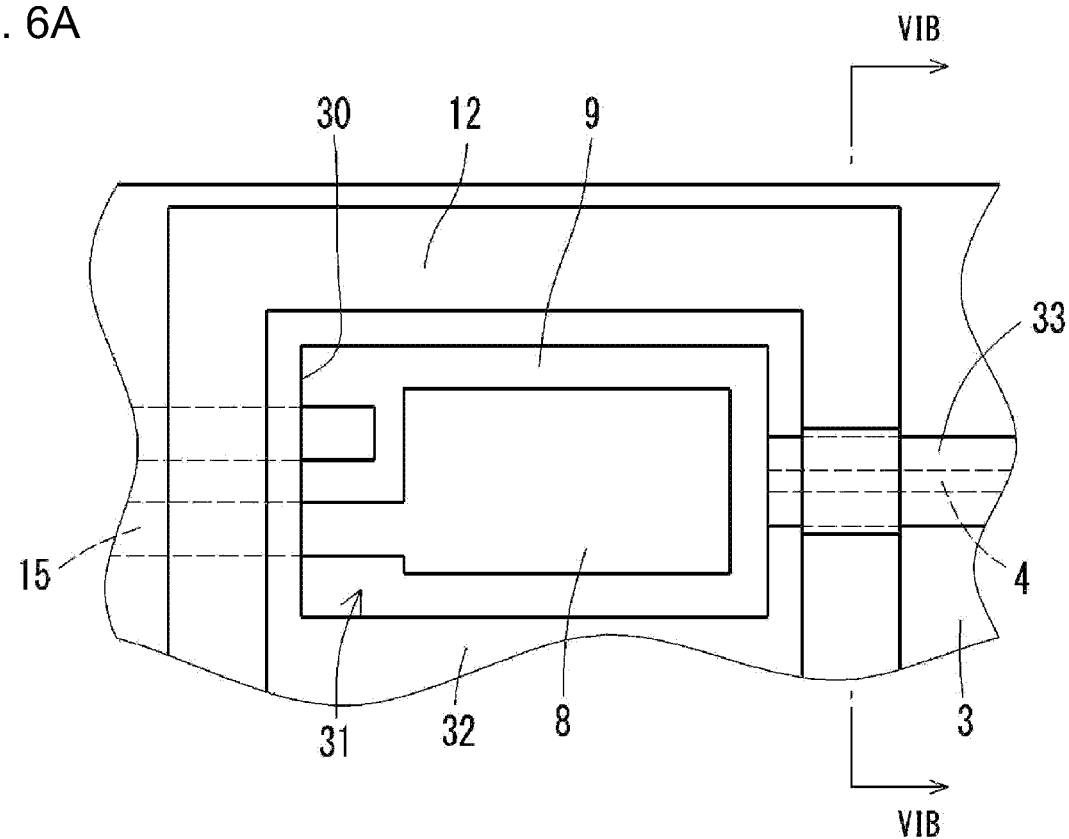
FIG. 6A is a plan view of an optical waveguide package according to another embodiment of the present disclosure.
Figure 6B:
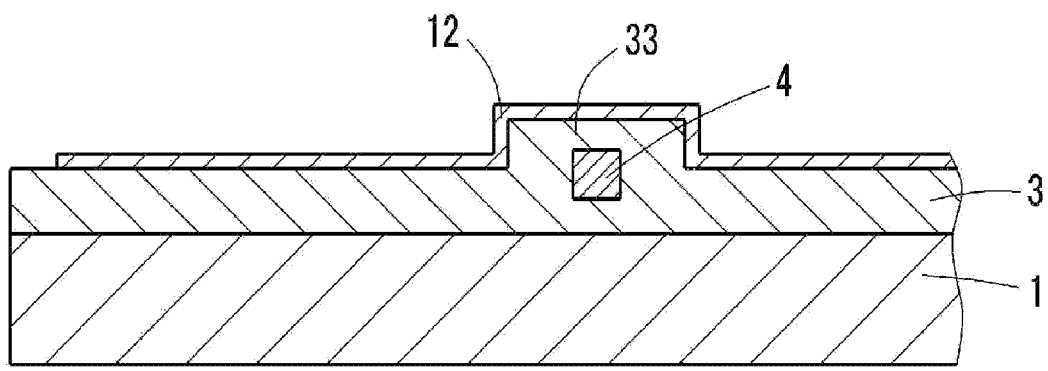
FIG. 6B is a cross-sectional view of the optical waveguide package taken along the section line in FIG. 6A.

FIG. 6A is a plan view of an optical waveguide package according to another embodiment of the present disclosure. FIG. 6B is a cross-sectional view of the optical waveguide package taken along the section line in FIG. 6A. The components corresponding to those in the above embodiments are given the same reference numerals and will not be described repeatedly. In the optical waveguide package according to the present embodiment, the cladding 3 includes a protrusion 33 above the core 4. The protrusion 33 protrudes from the second surface 3b of the cladding 3. The protrusion 33 is above the core 4 (adjacent to the second surface 3b). The core 4 may be at least partially within the protrusion 33. The protrusion 33 may be in, for example, the first region 3b1 and the second region 3b2 and may extend along the core 4.

For the cladding 3 with the metal member 12, the metal member 12 extends along the surface of the protrusion 33. For the lid 11 having a flat surface facing the cladding 3, the bond between the lid 11 and the metal member 12 is thinner on the protrusion 33 than on the other area. In other words, the protrusion 33 has a smaller amount of bond on its surface than the other area. Heat applied to join the lid 11 transfers through the bond and the metal member 12 to the cladding 3. The protrusion 33 having the smaller amount of bond reduces heat transferring to the core 4 below the protrusion 33, thus lowering the likelihood of deteriorating optical transmission characteristics under heat.

Figure 7A:
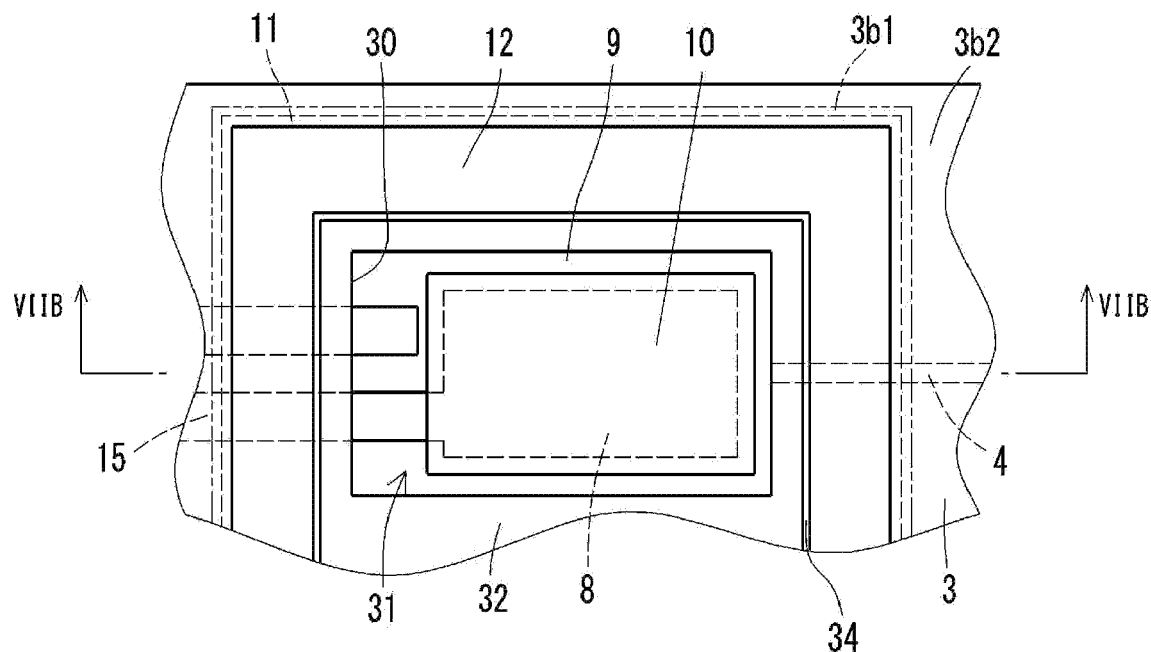
FIG. 7A is a plan view of a light-emitting device according to another embodiment of the present disclosure.
Figure 7B:
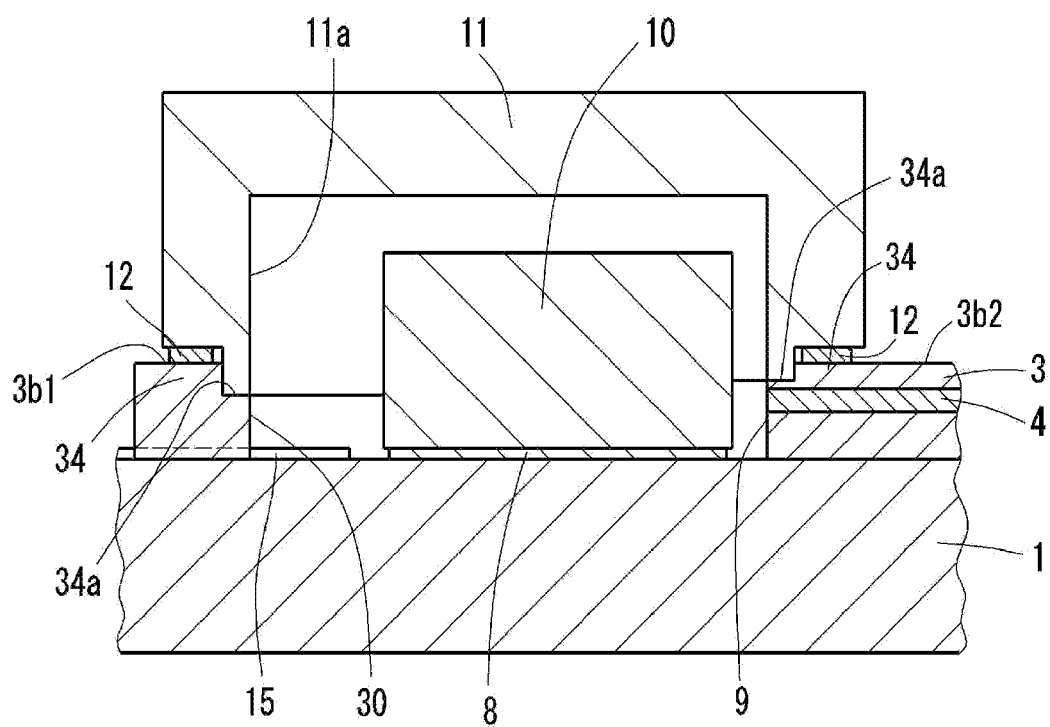
FIG. 7B is a cross-sectional view of the light-emitting device taken along the section line in FIG. 7A.

FIG. 7A is a plan view of a light-emitting device according to another embodiment of the present disclosure. FIG. 7B is a cross-sectional view of the light-emitting device taken along the section line in FIG. 7A. The components corresponding to those in the above embodiments are given the same reference numerals and will not be described repeatedly. In the light-emitting device according to the present embodiment, the cladding 3 includes, in the first region 3b1, a step 34 fitted with the lid 11. This structure increases the strength for joining the lid 11 to the cladding 3 with the metal member 12 in between. The step 34 may have any shape to fit to the lid 11. In the present embodiment, for example, the step 34 has a step surface 34a defined by an inner portion of the first region 3b1 (an edge of the through-hole 30) one step lower and closer to the first surface 3a of the cladding 3. The lid 11 may have any shape to fit to the step 34. For example, the lid 11 may include a step shaped in correspondence with the step 34. The metal member 12 may be located entirely or partially on the step 34. In the present embodiment, for example, the metal member 12 may be on an outer portion of the first region 3b1 (a portion surrounding the step surface 34a) without being located on the step surface 34a.

Figure 8:
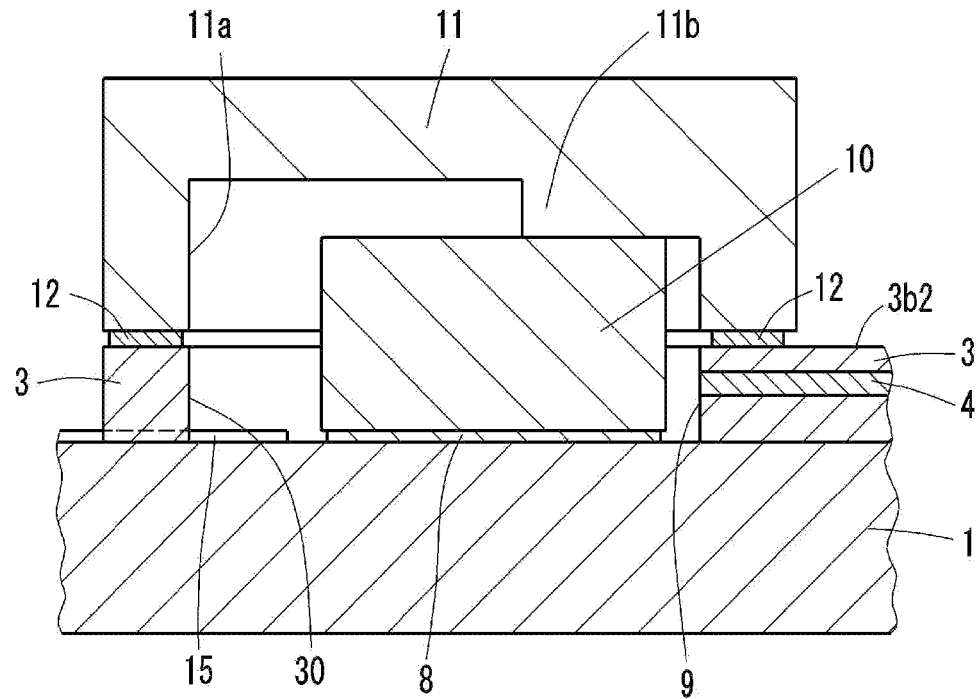
FIG. 8 is a cross-sectional view of a light-emitting device according to another embodiment of the present disclosure.

FIG. 8 is a cross-sectional view of a light-emitting device according to another embodiment of the present disclosure. The components corresponding to those in the above embodiments are given the same reference numerals and will not be described repeatedly. In the light-emitting device according to the present embodiment, the lid 11 includes a contact portion 11b in contact with the light-emitting elements 10. The contact portion 11b protrudes outward from the surface of the lid 11 facing the element-receiving areas 9. In the present embodiment, the lid 11 has a recess 11a receiving the contact portion 11b. The lid 11 joined to the cladding 3 with the metal member 12 in between may have the contact portion 11b in contact with the light-emitting elements 10. For the lid 11 with no contact portion 11b, the operating light-emitting elements 10 generate heat that mainly transfers through the element mounting portions 8 to the substrate 1 for dissipation. For the lid 11 with the contact portion 11b, the operating light-emitting elements 10 generate heat that transfers through the element mounting portions 8 to the substrate 1 and also transfers through the contact portion 11b to the lid 11 for dissipation, for example, from the surface of the lid 11. This reduces the effects of heat from the operating light-emitting elements 10.

Figure 9:
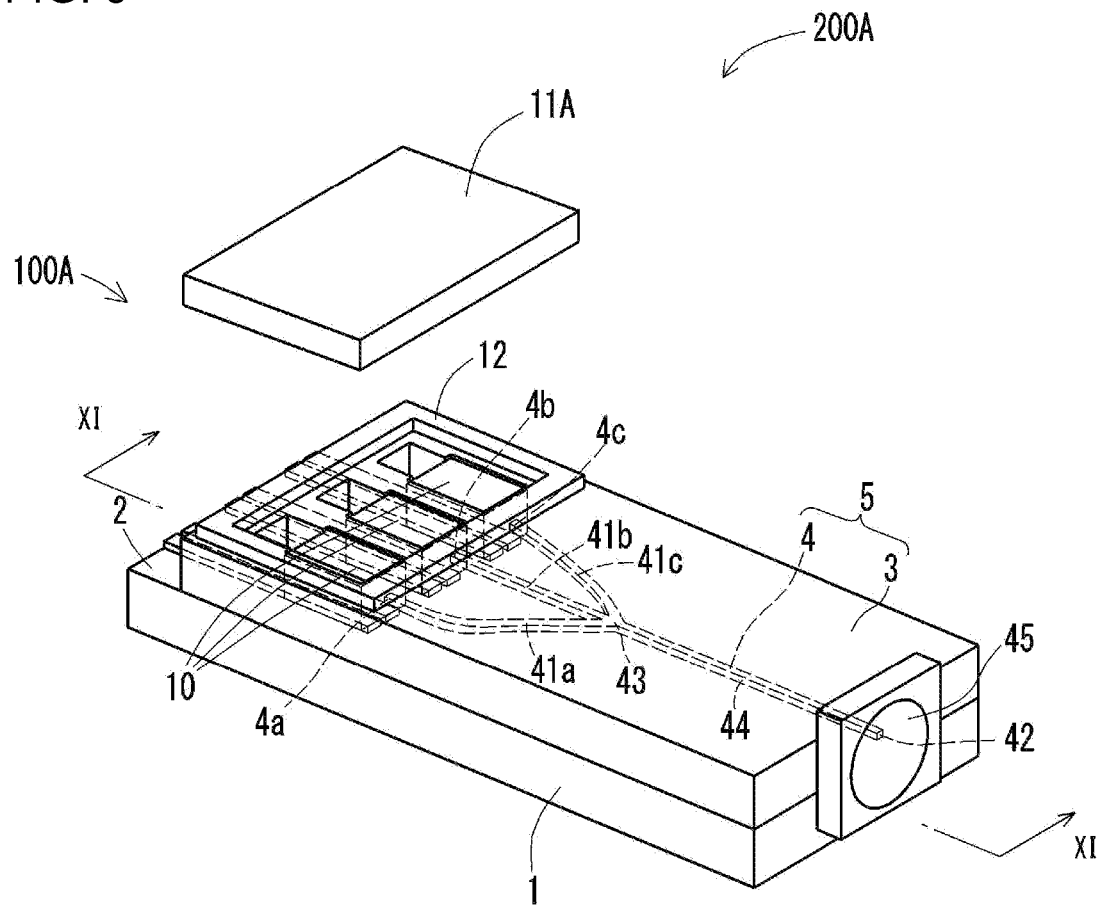
FIG. 9 is an exploded perspective view of a light-emitting device according to still another embodiment of the present disclosure.
Figure 10:
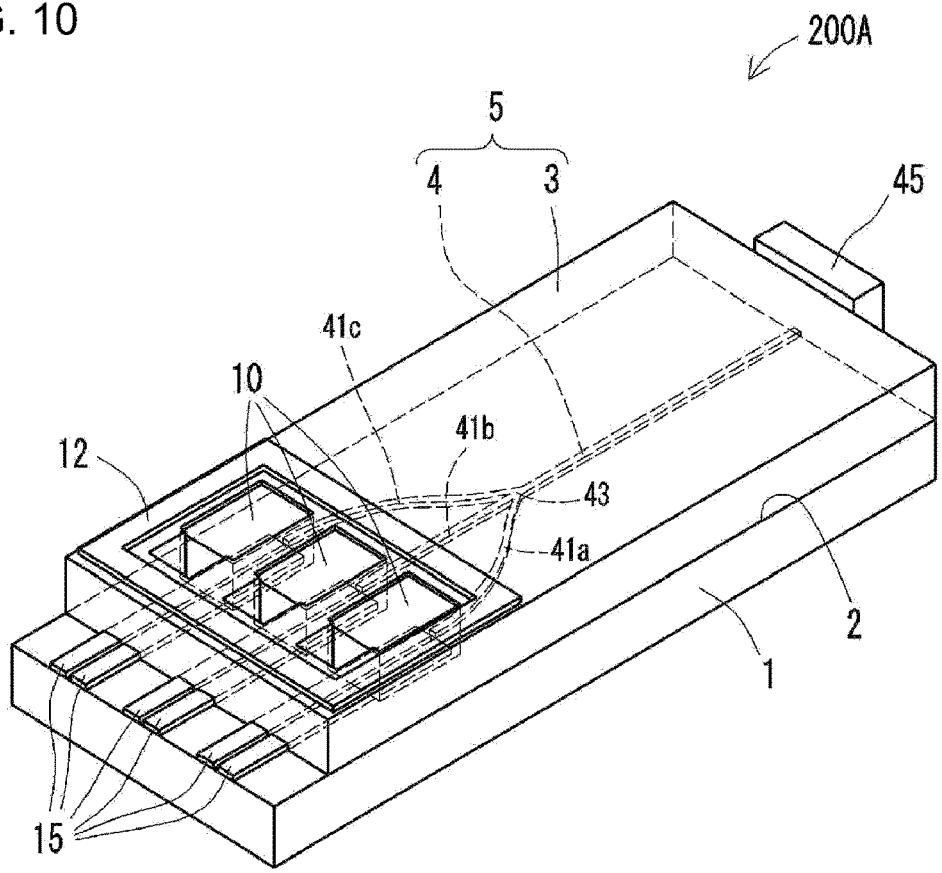
FIG. 10 is a perspective view of the light-emitting device in FIG. 9 without showing a lid.
Figure 11:
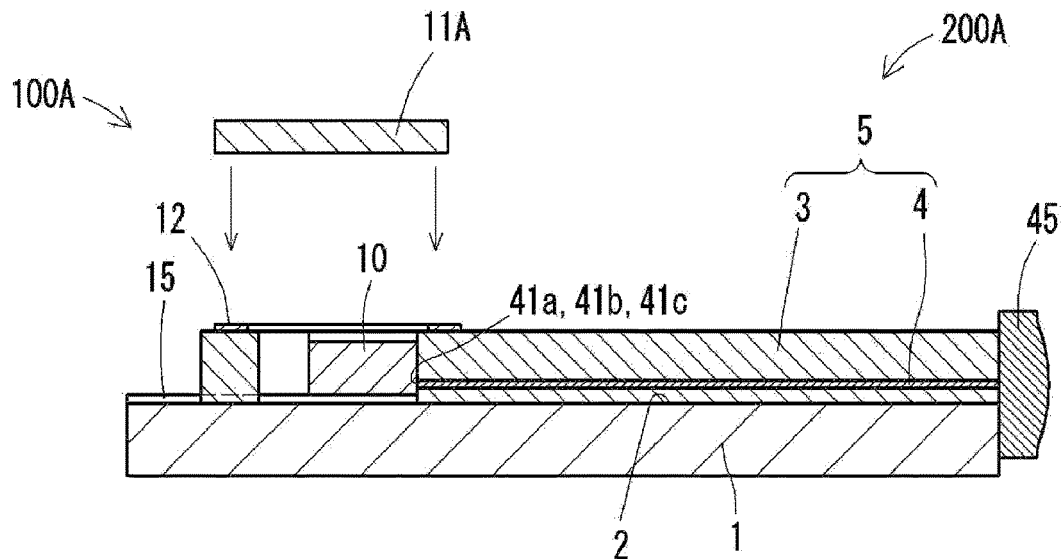
FIG. 11 is a cross-sectional view of the light-emitting device taken along the section line in FIG. 9.

FIG. 9 is an exploded perspective view of a light-emitting device 200A according to still another embodiment of the present disclosure. FIG. 10 is a perspective view of the light-emitting device 200A in FIG. 9 without showing a lid 11A. FIG. 11 is a cross-sectional view of the light-emitting device 200A taken along the section line in FIG. 9. The components corresponding to those in the above embodiments are given the same reference numerals and will not be described repeatedly. In the above embodiments, the light-emitting elements 10 include upper portions protruding from the cladding 3. The protruding portions are received in the recess 11a in the lid 11. In the present embodiment, for example, an optical waveguide package 100A includes a cladding 3 thicker than the light-emitting elements 10. The compartments 31 each accommodate the entire light-emitting element 10 and are covered with a plate-like lid 11A. This structure allows the lid 11A to have no recess 11a and thus simplifies the lid 11A.

In still another embodiment of the present disclosure, a light-emitting device 200 may include a thermistor. For example, the thermistor may be located to detect the temperature of the optical waveguide layer 5, or may be located in each compartment 31 to detect the temperature of the light-emitting element 10, or may be located on each external wiring member 15 outside the compartments 31. The light-emitting device 200 may also include a light-receiving element in each compartment 31. A light-receiving element is located opposite to the incident end face 4a from a light-emitting element 10. The light-emitting element 10 emits light toward the incident end face 4a and simultaneously emits the same light in the opposite direction. The light-receiving element can receive and observe the light from the light-emitting element 10 to control the output from the light-emitting element 10.

In still another embodiment of the present disclosure, the light-emitting elements 10 are not limited to light-emitting diodes (LEDs) but may be, for example, laser diodes (LDs) or vertical cavity surface emitting lasers (VCSELs).

Although embodiments of the present disclosure have been described in detail, the present disclosure is not limited to the embodiments described above, and may be changed or modified in various manners without departing from the spirit and scope of the present disclosure. The components described in the above embodiments may be entirely or partially combined as appropriate unless any contradiction arises.

REFERENCE SIGNS LIST 1 substrate
2 upper surface
3 cladding
3a first surface
3b second surface
4 core
4a, 4b, 4c incident end face
5 optical waveguide layer
8 element mounting portion
9 element-receiving area
10 light-emitting element
11, 11A lid
11a recess
11b contact portion
12 metal member
15 external wiring member
30 through-hole
31 compartment
32 partition
33 protrusion
34 step
34a step surface
3b1 first region
3b2 second region
41a, 41b, 41c branching path
42 emission end face
43 merging portion
44 joined path
45 lens
100, 100A optical waveguide package
200, 200A light-emitting device

The invention claimed is:

1. An optical waveguide package, comprising:
a substrate;
a cladding on the substrate, the cladding including a first surface facing the substrate, a second surface opposite to the first surface, an element-receiving area being open in the second surface, and a protrusion protruding from the second surface;
a core in the cladding and extending from the element-receiving area, wherein the protrusion is above the core;
a lid covering the element-receiving area;
a bond member surrounding the element-receiving area between the cladding and the lid; and
an external wiring member electrically connecting an element in the element-receiving area to an external circuit,
wherein
the external wiring member is not located between the lid and the cladding,
the lid faces the second surface and the protrusion, and
the bond member is located above the second surface and the protrusion.

2. The optical waveguide package according to claim 1, wherein
the second surface includes a first region surrounding the element-receiving area in a plan view and a second region other than the first region, and
the lid is located only on the first region.

3. The optical waveguide package according to claim 2, wherein
the cladding includes a step in the first region, and
the lid is fitted to the step.

4. The optical waveguide package according to claim 2, wherein the protrusion extends from the first region to the second region.

5. The optical waveguide package according to claim 1, wherein
the cladding includes a plurality of the element-receiving areas and a partition between the plurality of element-receiving areas.

6. The optical waveguide package according to claim 1, wherein
the lid includes a contact portion to be in contact with a light-emitting element.

7. The optical waveguide package according to claim 1, wherein
the external wiring member penetrates the cladding.

8. The optical waveguide package according to claim 1 further comprising:
a first metal member located on the second surface and located between the bond member and the cladding.

9. The optical waveguide package according to claim 8, wherein
the lid further includes a second metal member on a surface facing the second surface, and
the bond member is located between the first metal member and the second metal member.

10. The optical waveguide package according to claim 8, wherein
the first metal member is located on the protrusion.

11. The optical waveguide package according to claim 10, wherein the bond member between the lid and the first metal member is thinner on the protrusion than on other area.

12. The optical waveguide package according to claim 1, wherein the protrusion extends along the core.

13. The optical waveguide package according to claim 1, wherein the core is at least partially within the protrusion.

14. A light-emitting device, comprising:
the optical waveguide package according to claim 1; and
a light-emitting element in the element-receiving area, the light-emitting element is die-bonded to the external wiring member.

15. The optical waveguide package according to claim 1 further comprising:
a light-receiving element in the element-receiving area.

16. A light-emitting device, comprising:
a substrate;
a cladding on the substrate, the cladding including a first surface facing the substrate, a second surface opposite to the first surface, an element-receiving area being open in the second surface, and a protrusion;
a core in the cladding and extending from the element-receiving area, wherein the protrusion is above the core;
a lid having a recess and covering the element-receiving area;
a light-emitting element in the element-receiving area;
a bond member surrounding the element-receiving area between the cladding and the lid and located above the protrusion; and
an external wiring member electrically connecting the light-emitting element to an external circuit; and
a lens on an optical path of light to be emitted from the core, wherein the external wiring member is not located between the lid and the cladding, and the light-emitting element extends from the element-receiving area into the recess.

\* \* \* \* \*